United States Patent
Sugai

[11] Patent Number: 6,143,671
[45] Date of Patent: Nov. 7, 2000

[54] SEMICONDUCTOR DEVICE MANUFACTURING METHOD

[75] Inventor: Kazumi Sugai, Tokyo, Japan

[73] Assignee: NEC Corporation, Tokyo, Japan

[21] Appl. No.: 09/195,695

[22] Filed: Nov. 19, 1998

[30] Foreign Application Priority Data

Nov. 21, 1997 [JP] Japan ................................... 9-337838

[51] Int. Cl.⁷ ................................................ H01L 21/469
[52] U.S. Cl. ........................ 438/783; 438/778; 438/787; 438/766; 438/627; 438/637; 438/643; 438/653; 438/672
[58] Field of Search .................................. 438/783, 778, 438/787, 766, 627, 637, 643, 653, 672

[56] References Cited

U.S. PATENT DOCUMENTS 5,795,915  6/1998  Matsunaga et al. .................... 438/627

FOREIGN PATENT DOCUMENTS

| | | |
|---|---|---|
| 57-107053 | 7/1982 | Japan . |
| 4-144230 | 5/1992 | Japan . |
| 5-217884 | 8/1993 | Japan . |
| 7-130598 | 5/1995 | Japan . |
| 9-251943 | 9/1997 | Japan . |

*Primary Examiner*—David Nelms
*Assistant Examiner*—Quoc Hoang
*Attorney, Agent, or Firm*—McGinn & Gibb, P.C.

[57] ABSTRACT

A semiconductor device manufacturing method comprises the steps of depositing a first insulation coating on a substrate, forming a wiring groove on the first insulation coating, depositing aluminum or its alloy on the wiring groove, eliminating the aluminum or its alloy deposited over the other portion than the wiring groove, depositing a second insulation coating doped with at least B or P on the substrate, depositing a third insulation coating on the second insulation coating, applying a photoresist on the third insulation coating, and exposing the photoresist to a light of short wavelength.

14 Claims, 3 Drawing Sheets

SEMICONDUCTOR DEVICE MANUFACTURING METHOD

BACKGROUNDS OF THE INVENTION

1. Field of the Invention

The present invention relates to a manufacturing method of a semiconductor device having a fine pattern, and more particularly to a semiconductor device manufacturing method capable of inhibiting any break of a resist pattern caused by the reflection of an exposure light and thereby realizing fine patterning.

2. Description of the Related Art

Recently, a design rule of an LSI (Large Scale Integration) is becoming finer and finer for the pursuit of higher density and higher speed in the LSI. According to this, the wavelength of an exposure light is trending toward shorter, for example, from 365 nm (i-line of a mercury lamp) to 248 nm (KrF excimer laser). Further, a light of 193 nm (ArF excimer laser) is being used for fine patterning, as an exposure light.

In case of forming a fine pattern by use of such an exposure light of short wavelength, the conventional anti-reflective coating has such a problem that a resist pattern is easily broken due to the reflection of an exposure light; therefore, it is difficult to obtain a desired fine pattern. Especially, in case of patterning an insulation coating between layers on aluminum wiring formed by the damascene method, break of a resist pattern occurs due to the reflection of an exposure light from the aluminum wiring as an underlayer.

In order to form a desired fine pattern by use of such a short length exposure light, O, N, and C ion-implanted amorphous silicon is used as an antireflective coating in the conventional anti-reflective coating manufacturing method disclosed in Japanese Patent Publication Laid-Open No. 7-130598, and a manner of implanting Ce ion into the $SiO_2$ as an anti-reflective coating and thereby heating the same is described in a pattern forming method disclosed in Japanese Patent Publication Laid-Open No. 5-217884.

As mentioned above, in case of forming a fine pattern by use of an exposure light of short length, the conventional anti-reflective coating has such a problem that a resist pattern is easily broken due to the reflection of an exposure light; therefore a desired fine pattern cannot be obtained. For example, in patterning an insulation coating between layers on the aluminum wiring formed in the damascene method, break of a resist pattern occurs by the reflection of an exposure light from the aluminum wiring.

In the method of using an amorphous silicon as the anti-reflective coating in order to inhibit break of such a resist pattern, which is disclosed in Japanese Patent Publication Laid-Open No. 7-130598, if the amorphous silicon of a semiconductor is not turned to be an insulation coating by ion implantation, insulating ability between the wiring cannot be provided enough when an object to be patterned is a metal coating; accordingly, implantation of high density ion is required in order to enhance the insulating ability of the amorphous silicon. Therefore, productivity is deteriorated by an increase in defect density of a semiconductor device caused by the ion implantation damage into a substrate and by an increase in ion implantation time, which results in increasing the cost of a semiconductor device.

In the method of implanting Ce ion into $SiO_2$ as an anti-reflective coating in Japanese Patent Publication Laid-Open No. 5-217884, Ce cannot be used for any other purpose than this in a semiconductor manufacturing process; therefore, it is necessary to provide extra Ce sources in an ion implantation device, which results in increasing the manufacturing cost of a semiconductor device.

SUMMARY OF THE INVENTION

An object of the present invention is to provide a semiconductor device manufacturing method capable of inhibiting any break of a resist pattern caused by the reflection of an exposure light and thereby realizing fine patterning, in order to solve the above conventional problem.

A second object of the present invention is to provide a semiconductor device manufacturing method capable of reducing the chip area of a semiconductor device and thereby reducing the manufacturing cost thereof.

A third object of the present invention is to provide a semiconductor device manufacturing method free from the reduction of productivity caused by an increase of the ion implantation time and an increase of the defect density of a semiconductor device caused by the ion implantation damage into a substrate.

Further, a fourth object of the present invention is to provide a semiconductor device manufacturing method in which it is not necessary to provide extra Ce sources in an ion implantation device, differently from the conventional method of implanting Ce ion into $SiO_2$ as an anti-reflective coating.

According to one aspect of the invention, a semiconductor device manufacturing method, comprising the steps of depositing an insulation coating doped with at least one of B and P on a substrate, applying a photoresist on the insulation coating, and exposing the photoresist to a light of short wavelength.

In the preferred construction, the semiconductor device manufacturing method further comprises depositing aluminum or its alloy on a substrate, before the step of depositing an insulation coating doped with at least B or P thereon.

In another preferred construction, the insulation coating doped with at least B or P is formed by adding at least B or P to $SiO_2$.

In another preferred construction, the semiconductor device manufacturing method further comprises depositing aluminum or its alloy on a substrate, before the step of depositing an insulation coating doped with at least B or P thereon, wherein the insulation coating doped with at least B or P is formed by adding at least B or P to $SiO_2$.

In another preferred construction, the insulation coating doped with at least B or P has 0.1 wt % or more concentration of B and/or P.

In another preferred construction, the insulation coating is formed by adding at least B or P whose concentration is 0.1 wt % or more to $SiO_2$.

In another preferred construction, a light of short wavelength for exposing the photoresist has the wavelength of 200 nm or less.

Also, the insulation coating is formed by adding at least B or P whose concentration is 0.1 wt % or more to $SiO_2$, and a light of short wavelength for exposing the photoresist has the wavelength of 200 nm or less.

According to another aspect of the invention, a semiconductor device manufacturing method, comprising the steps of depositing a first insulation coating on a substrate, forming a wiring groove on the first insulation coating, depositing aluminum or its alloy on the wiring groove, eliminating the aluminum or its alloy deposited over the other portion than the wiring groove, depositing a second insulation coating doped with at least B or P on the substrate, depositing a third insulation coating on the second insulation coating, applying a photoresist on the third insulation coating, and exposing the photoresist to a light of short wavelength.

In the preferred construction, the insulation coating doped with at least B or P is formed by adding at least B or P to $SiO_2$.

In another preferred construction, the insulation coating has 0.1 wt % or more concentration of B and/or P.

In another preferred construction, the insulation coating is formed by adding at least B or P whose concentration is 0.1 wt % or more to $SiO_2$.

In another preferred construction, a light of short wavelength for exposing the photoresist has the wavelength of 200 nm or less.

In another preferred construction, the insulation coating is formed by adding at least B or P whose concentration is 0.1 wt % or more to $SiO_2$, and a light of short wavelength for exposing the photoresist has the wavelength of 200 nm or less.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Recently, in order to form a fine pattern, a light of 193 nm (ArF excimer laser) is being used as an exposure light, and there exists 148 nm (F2 laser) as a shorter length light. With respect to such an exposure light of short length, it has turned out that $SiO_2$ coating of high transmittance can be used as an antireflective coating in a visible range, differently from the conventional anti-reflective coating; however, the transmittance of only $SiO_2$ is too large and it is necessary to thicken the coating of $SiO_2$. Therefore, it is not suitable for manufacturing a semiconductor device.

Then, it has been newly found that if adding 0.1 wt % or more B (boron) to $SiO_2$, or adding 0.1 wt % or more P (phosphorus) thereto, the transmittance of the $SiO_2$ coating becomes 10% or below even when the thickness of the coating is 100 Å; therefore, any pattern break of a photoresist in lithography would not occur. Especially, even if reflection occurs from aluminum wiring in patterning an insulation coating on the aluminum wiring formed by the damascene method, a desired fine pattern can be formed without any break of a resist pattern, in the $SiO_2$.coating formed as mentioned above.

FIGS. 1A to 1D are a cross-sectional view of a semiconductor device in the main manufacturing process of a semiconductor device manufacturing method of the present invention. In this embodiment, the description will be made in the case where the manufacturing method of the present invention is adopted in the wiring process of a silicon integrated circuit.

Figure 1A:
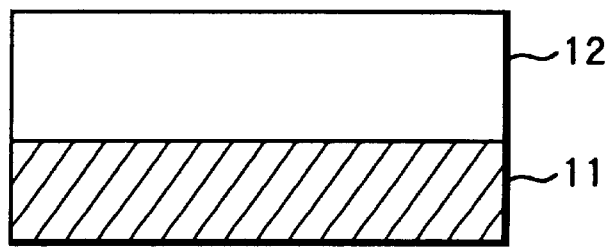
FIG. 1A is a cross-sectional view showing the first process in the main manufacturing process according to a first embodiment of a semiconductor device manufacturing method of the present invention.

FIG. 1A shows a cross-sectional view of a semiconductor device on which the $SiO_2$ coating has been deposited, according to the standard integrated circuit manufacturing method. In FIG. 1A, the reference numeral 11 is Si (silicon) substrate, and the reference numeral 12 is $SiO_2$ coating (silicon oxide coating).

Figure 1B:
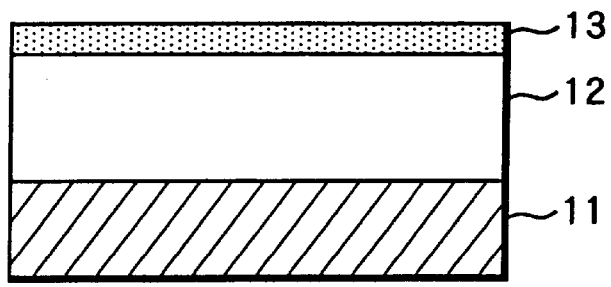
FIG. 1B is a cross-sectional view showing the second process in the main manufacturing process according to a first embodiment of a semiconductor device manufacturing method of the present invention.

As illustrated in FIG. 1B, B dope $SiO_2$ layer 13 is deposited there this time. The B dope $SiO_2$ layer 13 is deposited 100 Å thick in the normal pressure CVD method by use of $SiH_4$, $O_2$, and $B_2H_5$ at the temperature of the substrate 400 to 450° C. The concentration of B (boron) in this B dope $SiO_2$ layer 13 is defined as 3 wt %.

Figure 1C:
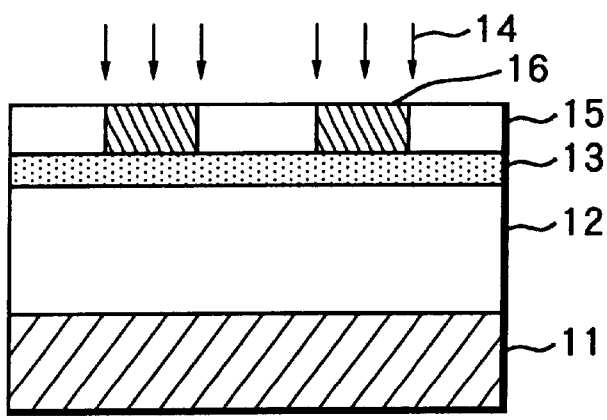
FIG. 1C is a cross-sectional view showing the third process in the main manufacturing process according to a first embodiment of a semiconductor device manufacturing method of the present invention.

This time, after depositing photoresist 15 there, each pattern is copied on the photoresist 15 by using ArF excimer laser as an exposure light 14, as illustrated in FIG. 1C.

The ArF excimer laser is almost absorbed by the second B dope $SiO_2$ layer 13 and the reflected light is 5% or less. Each pattern on the photoresist 15 will not be broken by the reflected light and a desired pattern can be obtained. The reference numeral 16 indicates the exposed photoresist. The exposure amount of the exposure light 14 is defined as 10 to 100 mJ/cm2 and the exposure time is defined as 100 msec.

Figure 1D:
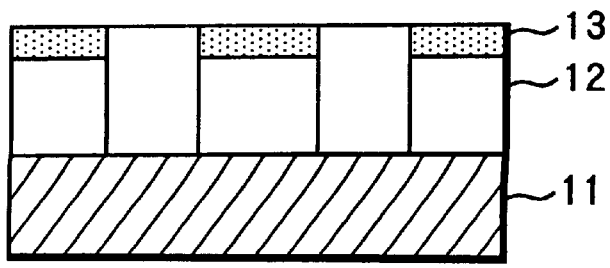
FIG. 1D is a cross-sectional view showing the fourth process in the main manufacturing process according to a first embodiment of a semiconductor device manufacturing method of the present invention.

Patterning the $SiO_2$ layer 12 and striping the resist by the dry etching, such an insulated pattern as illustrated in FIG. 1D can be obtained.

Here, the B dope $SiO_2$ layer 13 can be used as an insulation coating by itself, with no need of eliminating, which can restrain an increase in the manufacturing cost of a semiconductor device.

This time, the second embodiment according to the semiconductor device manufacturing method of the present invention will be described with reference to the drawings.

FIGS. 2A to 2F are a cross-sectional view of a semiconductor device in the main process of a semiconductor device manufacturing method of the present invention. This embodiment shows the case where the present invention is adopted in the fabrication process of the damascene wiring in a silicon integrated circuit.

Figure 2A:
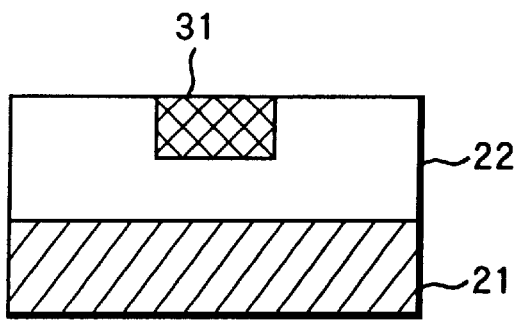
FIG. 2A is a cross-sectional view showing the first process in the main manufacturing process according to a second embodiment of the semiconductor device manufacturing method of the present invention.

FIG. 2A shows a cross-sectional view of a substrate on which the Al (aluminum) damascene wiring has been performed. In FIG. 2A, the reference numeral 21 is Si (silicon) substrate, the reference numeral 22 is a first $SiO_2$ layer (silicon oxide layer), and the reference numeral 31 is the first Al deposited on a wiring groove formed on the first $SiO_2$ layer 22. In the damascene wiring, the Al deposited over the portion other than the wiring groove of the first $SiO_2$ layer 22, that is an insulation coating, is eliminated, and the Al wiring of high reflectivity is bared on the first $SiO_2$ layer 22.

Figure 2B:
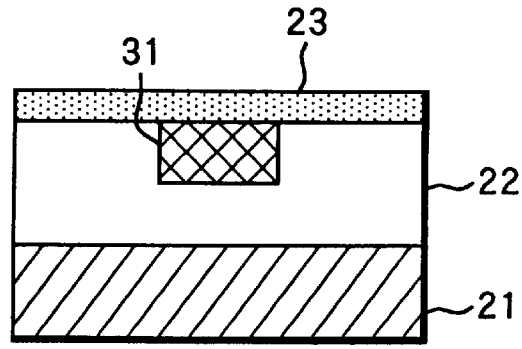
FIG. 2B is a cross-sectional view showing the second process in the main manufacturing process according to a second embodiment of the semiconductor device manufacturing method of the present invention.

As illustrated in FIG. 2B, the first B dope $SiO_2$ layer 23 is deposited 100 Å thick in the normal pressure CVD method. The forming condition of the B dope $SiO_2$ layer 23 is the same as the above-mentioned first embodiment.

Figure 2C:
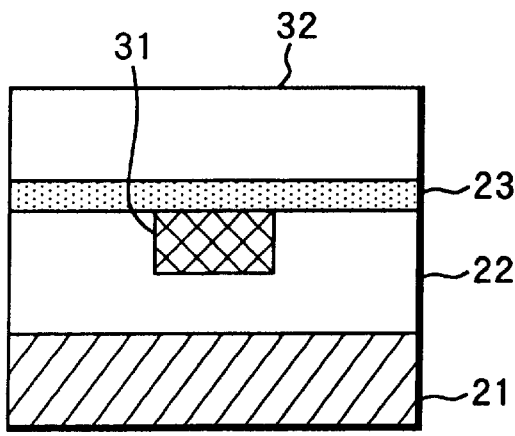
FIG. 2C is a cross-sectional view showing the third process in the main manufacturing process according to a second embodiment of the semiconductor device manufacturing method of the present invention.

As illustrated in FIG. 2C, a second $SiO_2$ layer 32 is deposited 1.5 μm thick by the plasma CVD method.

Figure 2D:
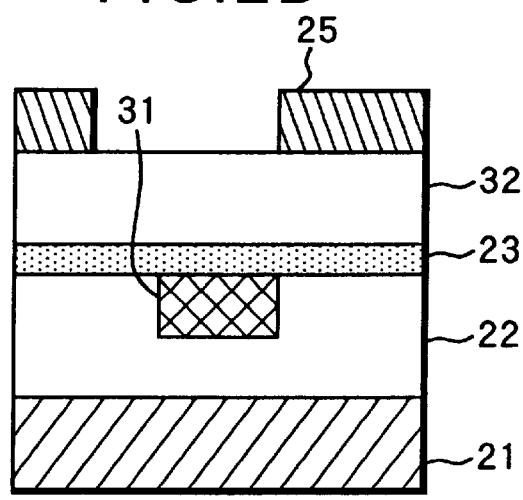
FIG. 2D is a cross-sectional view showing the fourth process in the main manufacturing process according to a second embodiment of the semiconductor device manufacturing method of the present invention.
Figure 2E:
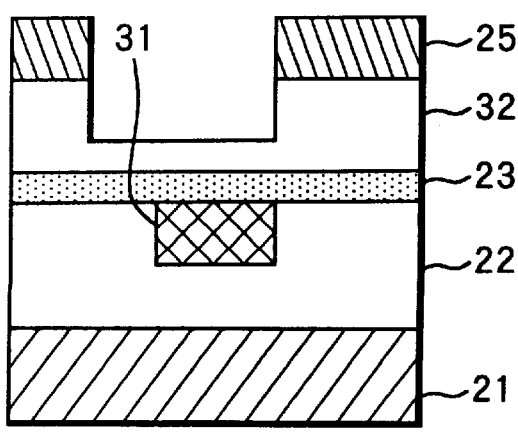
FIG. 2E is a cross-sectional view showing the fifth process in the main manufacturing process according to a second embodiment of the semiconductor device manufacturing method of the present invention.

Then, as illustrated in FIG. 2D, after the photoresist 25 is applied there, if lithography is performed by use of the ArF excimer laser as a light source, a desired pattern can be obtained without any damage from the reflected light from the lower first Al layer 31. Based on the resist pattern, a groove is formed on the second $SiO_2$ layer 32 by the dry etching as illustrated in FIG. 2E.

Figure 2F:
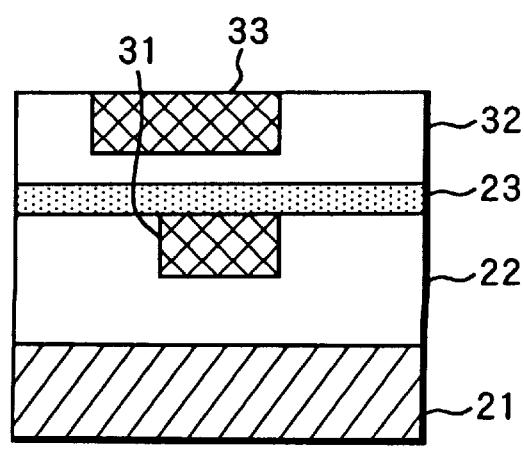
FIG. 2F is a cross-sectional view showing the sixth process in the main manufacturing process according to a second embodiment of the semiconductor device manufacturing method of the present invention.

Further, after the second Al 33 is deposited, the damascene wiring is formed by the chemical/mechanical polishing as illustrated in FIG. 2F.

Figure 3:
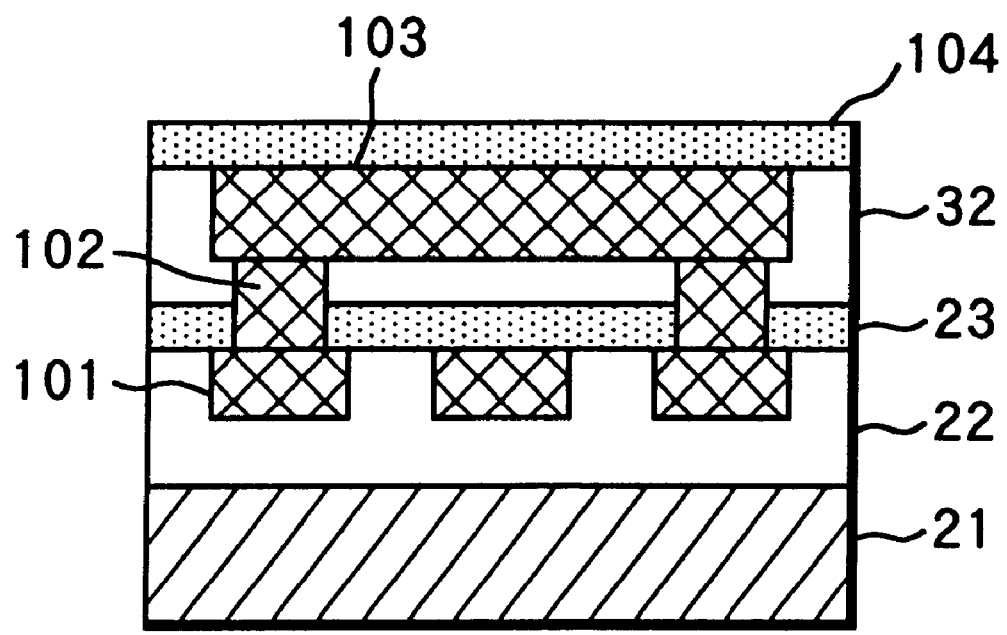
FIG. 3 is a cross-sectional view of a semiconductor device formed according to the semiconductor device manufacturing method shown in FIG. 2.

FIG. 3 shows a cross-sectional view of a semiconductor device formed by the semiconductor device manufacturing method shown in FIG. 2.

In FIG. 3, the reference numeral 21 is Si substrate, the reference numeral 22 is a first $SiO_2$ layer, the reference numeral 23 is a first B dope $SiO_2$ layer, the reference numeral 32 is a second $SiO_2$ layer, the reference numeral 101 is a first Al embedded wiring, the reference numeral 102 is a through-hole, the reference numeral 103 is a second Al embedded wiring, and the reference numeral 104 is a second B dope $SiO_2$ layer. This structure enables it to realize a semiconductor device having a finely multi-layered Al embedded wiring.

In the semiconductor device manufacturing method of the above mentioned first and second embodiments, the description has been made in the case where the B dope $SiO_2$ layer is used as an anti-reflective coating. However, it is also possible to use P (phosphorus) dope $SiO_2$ layer formed by use of $SiH_4, O_2$, and $PH_3$ in the normal pressure CVD method at the temperature of the substrate 400 to 450° C., as an anti-reflective coating. Further, it is also possible to use the $SiO_2$ layer doped with the both B and P. In any layer, as far as the concentration of B and/or P is respectively fixed as 0.1 wt % or more, it can serve as an anti-reflective coating.

This $SiO_2$ layer is already being used for manufacturing a semiconductor device and there exists such a semiconductor manufacturing device, thereby making it possible to restrain the manufacturing cost.

The above description has been made in case of using the ArF excimer laser; however, the same effect can be obtained also in case of using F2 laser of 148 nm wavelength.

As set forth hereinabove, according to the present invention, $SiO_2$ layer including at least one of B and P is used as an anti-reflective coating, so as to absorb an exposure light, thereby restraining the reflected light from the lower layer, inhibiting any break of a resist pattern, and enabling fine patterning. Especially, it can restrain the damage from the light reflected from the Al wiring in patterning an isolation coating between layers on the Al wiring formed by the damascene method, thereby realizing fine patterning.

According to the present invention, it is possible to reduce the chip area of an LSI, and thereby to reduce the manufacturing cost of the LSI.

Further, it doesn't need such ion implantation as in the conventional method of using amorphous silicon as an anti-reflective coating; therefore, the present invention will not deteriorate the productivity, with no increase in defect density of a semiconductor device caused by the shock of ion implantation into a substrate and no increase in ion implantation time.

Further, it is not necessary to provide extra Ce sources in an ion implantation device, differently from the conventional method of implanting Ce ion into $SiO_2$ layer as an anti-reflective coating.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor device manufacturing method, comprising the steps of:
    depositing an insulation coating doped with at least one of B and P on a substrate;
    applying a photoresist on the insulation coating; and
    exposing the photoresist to a light of short wavelength.

2. A semiconductor device manufacturing method as set forth in claim claim 1, further comprising
    depositing aluminum or its alloy on a substrate, before said step of depositing an insulation coating doped with at least B or P thereon.

3. A semiconductor device manufacturing method as set forth in claim 1, wherein
    the insulation coating doped with at least B or P is formed by adding at least B or P to $SiO_2$.

4. A semiconductor device manufacturing method as set forth in claim 1, further comprising depositing aluminum or its alloy on a substrate, before said step of depositing an insulation coating doped with at least B or P thereon, wherein the insulation coating doped with at least B or P is formed by adding at least B or P to $SiO_2$.

5. A semiconductor device manufacturing method as set forth in claim 1, wherein the insulation coating doped with at least B or P has 0.1 wt % or more concentration of B and/or P.

6. A semiconductor device manufacturing method as claimed in claim 1, wherein the insulation coating is formed by adding at least B or P whose concentration is 0.1 wt % or more to $SiO_2$.

7. A semiconductor device manufacturing method as claimed in claim 1, wherein a light of short wavelength for exposing the photoresist has the wavelength of 200 nm or less.

8. A semiconductor device manufacturing method as claimed in claim 1, wherein the insulation coating is formed by adding at least B or P whose concentration is 0.1 wt % or more to $SiO_2$, and a light of short wavelength for exposing the photoresist has the wavelength of 200 nm or less.

9. A semiconductor device manufacturing method, comprising the steps of:

depositing a first insulation coating on a substrate;

forming a wiring groove on the first insulation coating;

depositing aluminum or its alloy on the wiring groove;

eliminating the aluminum or its alloy deposited over the other portion than the wiring groove;

depositing a second insulation coating doped with at least B or P on the substrate;

depositing a third insulation coating on the second insulation coating;

applying a photoresist on the third insulation coating; and exposing the photoresist to a light of short wavelength.

10. A semiconductor device manufacturing method as set forth in claim 9, wherein the insulation coating doped with at least B or P is formed by adding at least B or P to $SiO_2$.

11. A semiconductor device manufacturing method as set forth in claim 9, wherien the insulation coating has 0.1 wt % or more concentration of B and/or P.

12. A semiconductor device manufacturing method as set forth in claim 9, wherein the insulation coating is formed by adding at least B or P whose concentration is 0.1 wt % or more to $SiO_2$.

13. A semiconductor device manufacturing method as set forth in claim 9, wherein a light of short wavelength for exposing the photoresist has the wavelength of 200 nm or less.

14. A semiconductor device manufacturing method as set forth in claim 9, wherein the insulation coating is formed by adding at least B or P whose concentration is 0.1 wt % or more to $SiO_2$, and a light of short wavelength for exposing the photoresist has the wavelength of 200 nm or less.

\* \* \* \* \*